US012270864B2

(12) United States Patent
Kim et al.

(10) Patent No.: US 12,270,864 B2
(45) Date of Patent: Apr. 8, 2025

(54) ELECTROCHEMICAL DEVICE COMPRISING SHORT CIRCUIT INDUCING MEMBER, AND SAFETY EVALUATION METHOD USING SAME

(71) Applicant: LG ENERGY SOLUTION, LTD., Seoul (KR)

(72) Inventors: Tae Jong Kim, Daejeon (KR); Seo Young Yoon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 206 days.

(21) Appl. No.: 17/599,719

(22) PCT Filed: Jul. 28, 2020

(86) PCT No.: PCT/KR2020/009952
§ 371 (c)(1),
(2) Date: Sep. 29, 2021

(87) PCT Pub. No.: WO2021/029574
PCT Pub. Date: Feb. 18, 2021

(65) Prior Publication Data
US 2022/0057456 A1      Feb. 24, 2022

(30) Foreign Application Priority Data
Aug. 9, 2019  (KR) .................. 10-2019-0097047

(51) Int. Cl.
*G01R 31/52*   (2020.01)
*G01R 31/385*  (2019.01)
(Continued)

(52) U.S. Cl.
CPC ........... *G01R 31/52* (2020.01); *G01R 31/385* (2019.01); *H01M 10/0585* (2013.01);
(Continued)

(58) Field of Classification Search
CPC ... G01R 31/52; G01R 31/385; H01M 50/463; H01M 10/0585; H01M 10/4235; H01M 10/4285; H01G 11/16; H01G 11/52
(Continued)

(56) References Cited

U.S. PATENT DOCUMENTS 5,912,089 A * 6/1999 Kitano ................ H01M 50/536
429/174
5,965,291 A * 10/1999 Pyszczek ............ H01M 50/437
429/105

(Continued)

FOREIGN PATENT DOCUMENTS

| CN | 103004003 A | 3/2013 |
| CN | 204614848 U | 9/2015 |

(Continued)

OTHER PUBLICATIONS

Office Action issued in corresponding Japanese Patent Application No. 2021-559677 dated Oct. 24, 2022.
(Continued)

*Primary Examiner* — Raul J Rios Russo
*Assistant Examiner* — Trung Q Nguyen
(74) *Attorney, Agent, or Firm* — MORGAN, LEWIS & BOCKIUS LLP

(57) ABSTRACT

The present technology relates to an electrochemical device comprising a separation membrane having a dotted line, and a short circuit inducing member, and a method capable of evaluating safety under internal short circuit conditions by using the electrochemical device. When using the electrochemical device of the present invention, it is possible to easily evaluate safety under internal short circuit conditions without physical deformation of an energy storage apparatus.

12 Claims, 3 Drawing Sheets

(51) Int. Cl.
*H01M 10/0585* (2010.01)
*H01M 10/42* (2006.01)
*H01M 50/463* (2021.01)
*H01G 11/16* (2013.01)
*H01G 11/52* (2013.01)

(52) U.S. Cl.
CPC ... *H01M 10/4235* (2013.01); *H01M 10/4285* (2013.01); *H01M 50/463* (2021.01); *H01G 11/16* (2013.01); *H01G 11/52* (2013.01)

(58) Field of Classification Search
USPC ........ 324/500, 510–515, 323–368, 600, 637, 324/200, 263, 522, 713, 76.11, 324/76.69–76.77
See application file for complete search history.

(56) References Cited

U.S. PATENT DOCUMENTS

| | | | | |
|---|---|---|---|---|
| 9,550,189 | B2* | 1/2017 | Oertmann | B03C 3/41 |
| 2006/0216586 | A1* | 9/2006 | Tucholski | H01M 50/186 |
| | | | | 429/185 |
| 2013/0209841 | A1* | 8/2013 | Keyser | H01M 10/4285 |
| | | | | 429/50 |
| 2013/0224632 | A1* | 8/2013 | Roumi | H01M 4/133 |
| | | | | 29/623.1 |
| 2013/0295416 | A1* | 11/2013 | Guen | H01M 50/583 |
| | | | | 429/7 |
| 2013/0330575 | A1* | 12/2013 | Baek | H01M 50/574 |
| | | | | 429/7 |
| 2018/0309112 | A1* | 10/2018 | Kim | H01M 10/0525 |
| 2021/0218049 | A1* | 7/2021 | Nakagawa | H01M 10/0468 |
| 2022/0045373 | A1* | 2/2022 | Yoon | H01M 50/463 |

FOREIGN PATENT DOCUMENTS

| | | |
|---|---|---|
| JP | 2005-100899 A | 4/2005 |
| JP | 2005-327616 A | 11/2005 |
| JP | 2007-157723 A | 6/2007 |
| JP | 2008-192495 A | 8/2008 |
| JP | 2008-218390 A | 9/2008 |
| JP | 2010-250954 A | 11/2010 |
| JP | 2012-104276 A | 5/2012 |
| JP | 2013-140759 A | 7/2013 |
| JP | 2017-182976 A | 10/2017 |
| JP | 2018-085245 A | 5/2018 |
| JP | 2018-113230 A | 7/2018 |
| JP | 6459850 B2 | 1/2019 |
| JP | 2019-021419 A | 2/2019 |
| JP | 2021-535568 A | 12/2021 |
| JP | 2022-523954 A | 4/2022 |
| KR | 2004-0107999 A | 12/2004 |
| KR | 10-0529097 B1 | 11/2005 |
| KR | 10-2008-0073667 A | 8/2008 |
| KR | 10-2011-0021970 A | 3/2011 |
| KR | 10-2011-0070905 A | 6/2011 |
| KR | 10-2012-0126630 A | 11/2012 |
| KR | 10-2013-0124189 A | 11/2013 |
| KR | 10-2014-0011136 A | 1/2014 |
| KR | 10-2014-0066364 A | 6/2014 |
| KR | 10-2014-0140092 A | 12/2014 |
| KR | 10-2016-0015898 A | 2/2016 |
| KR | 10-2017-0076053 A | 7/2017 |
| KR | 10-2018-0046370 A | 5/2018 |
| KR | 10-2018-0119046 A | 11/2018 |
| KR | 10-2019-0046483 A | 5/2019 |
| KR | 10-2019-0088033 A | 7/2019 |
| WO | 2016/111542 A1 | 7/2016 |

OTHER PUBLICATIONS

Extended European Search Report issued in corresponding European Patent Application No. 20851855.5 dated Apr. 14, 2022.
International Search Report (with partial translation) and Written Opinion dated Oct. 30, 2020 issued in corresponding International Patent Application No. PCT/KR2020/009952.
Office Action dated Aug. 13, 2024 issued in Korean Patent Application No. 10-2019-0097047.

* cited by examiner

[FIG. 1]
100
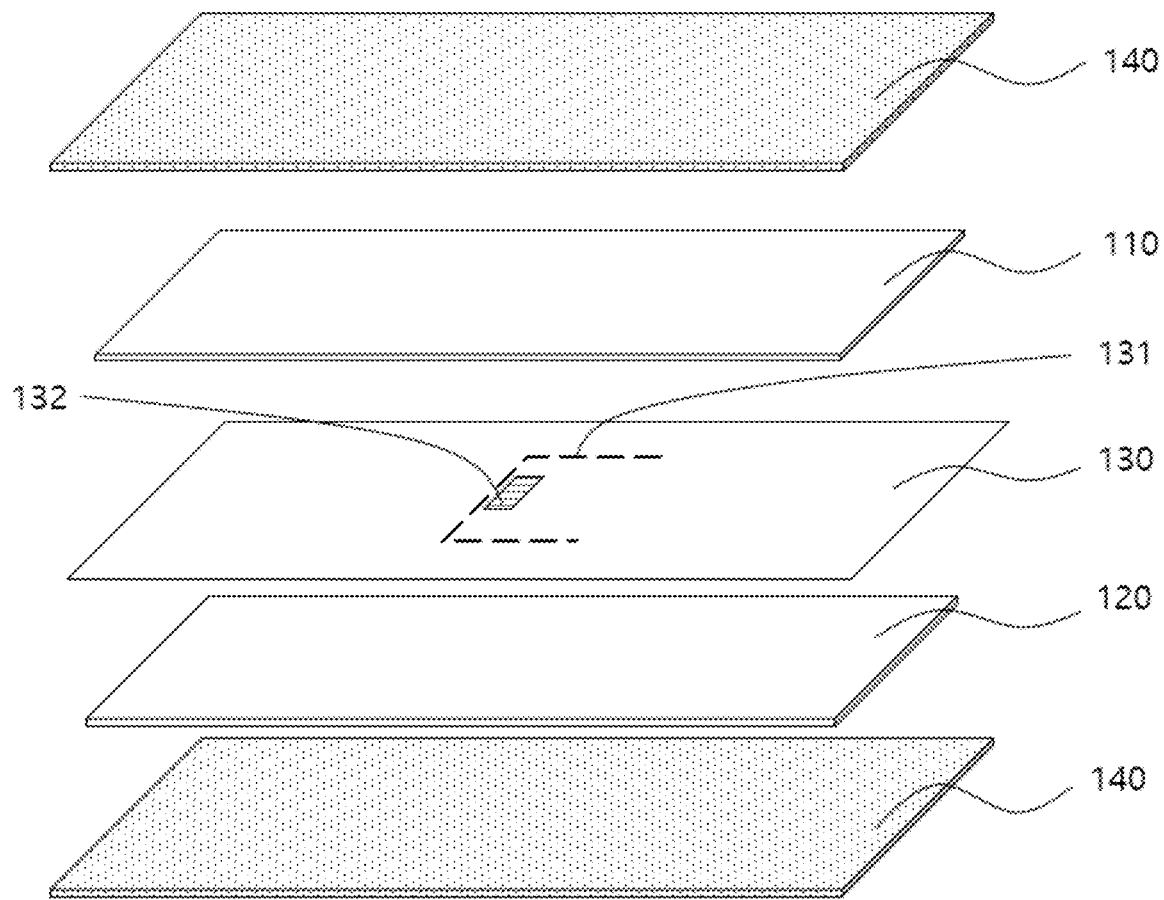

[FIG. 2]
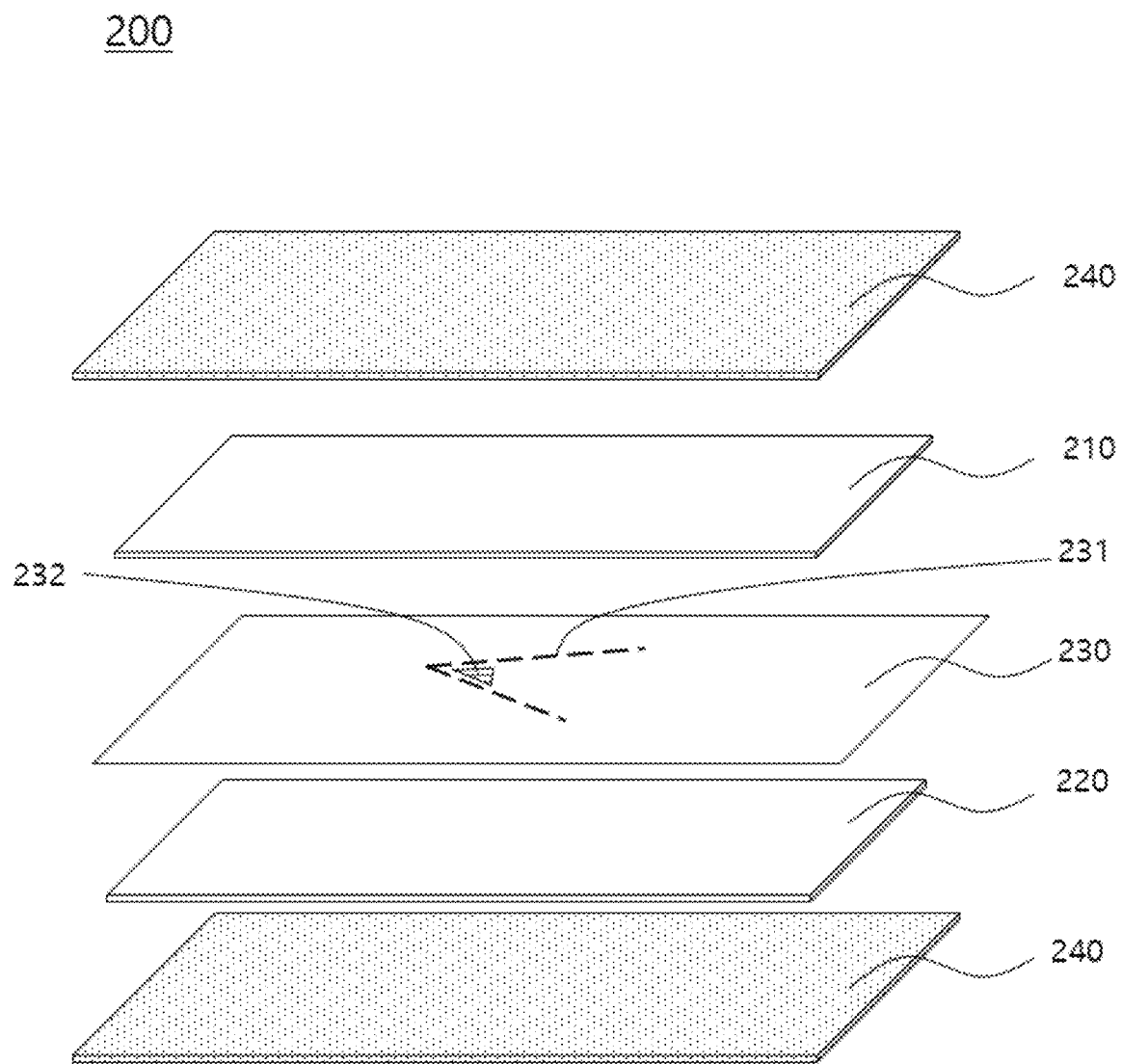

[FIG. 3]
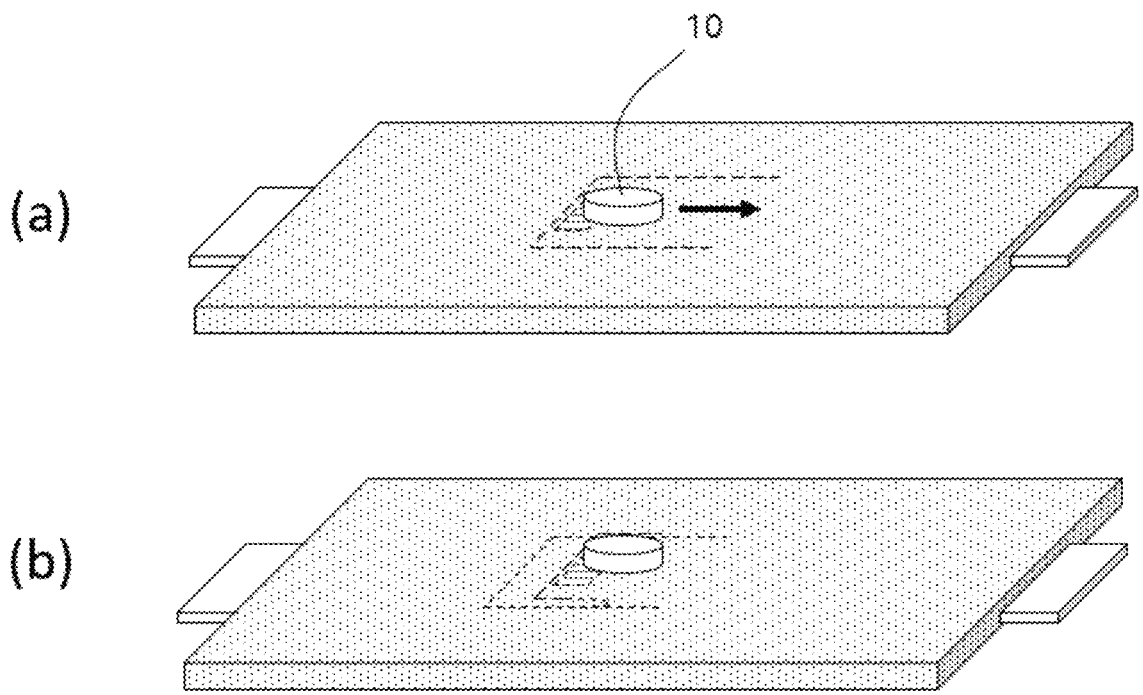

ELECTROCHEMICAL DEVICE COMPRISING SHORT CIRCUIT INDUCING MEMBER, AND SAFETY EVALUATION METHOD USING SAME

TECHNICAL FIELD

The present invention relates to an electrochemical device including a short circuit induction member and a method for evaluating the safety of the battery due to an internal short circuit using the electrochemical device.

This application claims the benefit of priority based on Korean Patent Application No. 10-2019-0097047, filed on Aug. 9, 2019, and the entire contents of the Korean patent application are incorporated herein by reference.

BACKGROUND ART

As the price of energy sources increases due to depletion of fossil fuels and the interest in environmental pollution increases, the demand for environmentally friendly alternative energy sources becomes an indispensable factor for future life. Especially, as technology development and demand for mobile devices are increasing, demand for secondary batteries as energy sources is rapidly increasing.

Typically, in terms of the shape of the battery, there is a high demand for a prismatic secondary battery and a pouch-type secondary battery that can be applied to products such as mobile phones with a small thickness. In terms of materials, there is a high demand for lithium secondary batteries such as lithium ion batteries and lithium ion polymer batteries having high energy density, discharge voltage, and output stability.

Generally, in order to prepare a secondary battery, first, a positive electrode and a negative electrode are formed by applying an electrode mixture containing an electrode active material to a surface of a current collector, then a separate is interposed therebetween to thereby make an electrode assembly, which is then mounted in a cylindrical or rectangular metal can or inside a pouch-type case of an aluminum laminate sheet, and a liquid electrolyte in injected or impregnated into the electrode assembly or a solid electrolyte to prepare a secondary battery.

Further, secondary batteries are classified according to the structure of the electrode assembly having a positive electrode/separator/negative electrode structure. Representative examples thereof include a jelly-roll (wound) electrode assembly in which long sheet type positive electrodes and negative electrodes are wound with a separator interposed therebetween, a stacked electrode assembly in which a plurality of positive and negative electrodes cut in a predetermined size unit are sequentially stacked with a separator interposed therebetween, and a stacked/foldable electrode assembly in which bi-cells or full cells, in which positive and negative electrodes of a predetermined unit are stacked with a separator interposed therebetween, are wound with a separator sheet.

On the other hand, the electrode generates a current through the exchange of ions, and the positive electrode and negative electrode constituting the electrode has a structure in which the electrode active material is applied to the electrode current collector made of metal.

In general, the negative electrode has a structure in which a carbon-based active material is coated on an electrode plate made of copper or aluminum, and the positive electrode has a structure in which an active material made of $LiCoO_2$, $LiMnO_2$, $LiNiO_2$, or the like is coated on an electrode plate made of aluminum, etc.

In order to manufacture a positive electrode or a negative electrode, an electrode mixture including an electrode active material is coated on an electrode current collector made of a long metal sheet in one direction.

The separator is positioned between the positive electrode and the negative electrode of the battery to perform insulation and maintain the electrolyte to provide a passage for ion conduction.

The secondary battery is a rechargeable battery that is manufactured using a material that can repeat a plurality of redox processes between a current and a material. When the reduction reaction is performed on the material by the current, the power is charged, and when the oxidation reaction is performed on the material, the power is discharged. Herein, as the charge-discharge is repeatedly performed, electricity is generated.

The lithium secondary battery has a problem of low safety while having excellent electrical properties. For example, lithium secondary batteries generate heat and gas due to decomposition reaction of active materials and electrolytes, which are battery components, under abnormal operating conditions such as overcharge, overdischarge, exposure to high temperatures, and the resulting high temperature and high pressure conditions further promote the decomposition reaction and sometimes cause a fire or explosion.

In addition, it is very important to secure the safety even when an internal short circuit occurs in the battery, and for this purpose, it is important to correctly evaluate the safety of the battery when the internal short circuit occurs. As a battery stability item for lithium secondary batteries, details about a battery evaluation test for evaluating heat generation behavior during internal short circuits are explained in UL Standard for Lithium Batteries (UL1642), Guidelines from the Battery Industry Association (SBA G1101-1997 Lithium Secondary Battery Safety Evaluation Criteria Guidelines), etc.

There have been a method of putting a heating element inside the battery cell to induce an internal short circuit and generating internal heat by the heating element, a method of pre-drilling an internal separator and treating the area with chemicals to thereby be dissolved at a certain temperature, and a method of inducing an internal short circuit by tearing the separator by inserting a certain type of metallic material and applying external force. However, in the first method, the actual product and shape would be different due to the heating element inside the cell and the external heating source. In case of the second method, it was necessary to deform the actually used separator and chemical treatment was performed on the part where the separator was damaged, so there was a problem that the characteristics may be different from the existing products, and the desired reaction may not occur due to side reactions caused by the chemical reaction inside the cell.

On the other hand, US Patent Publication No. 2013-0209841 (Patent Document 1) discloses an internal short circuit induction device of a battery, in which after a separator is perforated, a copper plate is inserted into a battery cell, then copper and aluminum plates are put on both sides of the separator, and a wax layer is then installed between the copper plate and the separator or between the aluminum plate and the separator. When the temperature rises above the melting point of the wax layer in the internal short circuit induction device, the wax layer is removed and the positive and negative electrodes are electrically connected by copper and aluminum plates, causing an internal short circuit. However, this method has a problem that the manufacturing process of the internal short circuit induction device is complicated and the cost is high, and the battery cell should be disassembled and reassembled for repeated use.

DISCLOSURE

Technical Problem

The present invention is invented to solve the above problems, and an object of the present invention is to provide an electrochemical device capable of testing safety due to an internal short circuit without physically altering the entire structure in a secondary battery, a capacitor, or other energy storage devices, and a safety evaluation method using such an electrochemical device.

Technical Solution

An electrochemical device according to the present invention to achieve the above object includes a structure in which a positive electrode, a separator, and a negative electrode are sequentially stacked. Herein, the separator has a structure in which a linear perforated line is formed, and a short circuit induction member attached to one side or both sides of the separator adjacent to the perforated line is provided.

At this time, the perforated line is characterized in that it is formed along a straight line, a curve, or a line formed of a combination of a straight line and a curve on the separator. That is, the shape of the line is not limited except for the shape of a single closed curve in which the line forms a closed figure such as a circle or a polygon.

Meanwhile, the perforated line is characterized in that it is made of a plurality of through-type slits or non-through-type grooves. However, in the case of a perforated line made of a through-type slit, it is preferable that the perforated line is formed as a linear slit having a sufficiently small width so that a short circuit does not occur through the formed slit. In the case of the non-through-type groove, the size or shape of the groove is not limited, such as linear, circular, polygonal, etc.

The short circuit induction member is characterized in that it contains one or two or more types of magnetic material selected from Fe, Ni, and Co, whereby the movement of the short circuit induction member becomes possible by the magnetic field applied at a position separated from the electrochemical device.

In addition, as the short circuit induction member moves, the separator on which the perforated line is formed is broken, and the positive electrode and the negative electrode directly contact each other through the broken portion, thereby causing an internal short circuit of the electrochemical device.

However, since the magnetic material included in the short circuit induction member may cause a short circuit when in contact with the positive electrode or the negative electrode, the outer circumferential surface may be surrounded by an insulating material. In this case, the insulating material may be a porous polymer film.

On the other hand, since the short circuit induction member of the present invention induces a short circuit by peeling off the separator along a perforated line while moving by a magnetic field, it should be physically connected to the separator. Therefore, for this purpose, the short circuit induction member may be attached to the separator by a binder.

The binder may contain one or more materials selected from polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, epoxy resin, ethylene-propylene-diene polymer (EPDM), sulfonated EPDM, styrene butadiene rubber or copolymers thereof, and may also be selectively used among known binders to which a separator can be attached.

Meanwhile, the safety evaluation method according to an internal short circuit using the electrochemical device can be used without limitation in an energy storage device including a positive electrode, a negative electrode, and a separator, such as a battery cell for a secondary battery and a capacitor, and specifically can be performed through the following steps:

preparing a separator having a perforated line formed thereon;

attaching a short circuit induction member including a magnetic material at a position adjacent to the perforated line;

applying a magnetic field to the short circuit induction member; and moving the short circuit induction member to break a perforated line portion of the separator.

When the short circuit induction member is moved to break the separator according to the above-described step, the positive electrode and the negative electrode directly contact through the broken portion, thereby inducing an internal short circuit.

Advantageous Effects

The electrochemical device including the short circuit induction member of the present invention improves the problem of physically irreversible deformation of energy storage devices such as battery cells and capacitors after the internal short circuit evaluation test, which was the biggest problem of conventional methods. The electrochemical device of the present invention does not undergo structural deformation except that the separator is partially broken, and may induce an internal short circuit in various states and environments. In addition, since it is possible to experiment and evaluate without disassembly and reassembly, the process is simple and time and cost can be saved.

BRIEF DESCRIPTION OF THE DRAWINGS

FIG. 1 schematically shows the structure of an electrochemical device including a short circuit induction member and a battery cell including the electrochemical device according to an embodiment of the present invention.

FIG. 2 schematically shows the structure of an electrochemical device including a short circuit induction member and a battery cell including the electrochemical device according to another embodiment of the present invention.

FIG. 3 is a schematic diagram sequentially showing a process of inducing a short circuit inside a battery cell by using a magnet and a battery cell including an electrochemical device having a short circuit induction member according to an embodiment of the present invention.

DETAILED DESCRIPTION OF THE PREFERRED EMBODIMENTS

As the inventive concept allows for various changes and numerous embodiments, particular embodiments will be illustrated in the drawings and described in detail in the text. However, this is not intended to limit the present invention to the specific form disclosed, and it should be understood to include all changes, equivalents, and substitutes included in the spirit and scope of the present invention.

In describing the drawings, similar reference numerals are used for similar elements. In the accompanying drawings, the dimensions of the structures are shown in an enlarged scale for clarity of the invention. The terms used to describe various components are for understanding, and the components should not be limited by the terms. The terms are used only for the purpose of distinguishing one component from another. For example, without departing from the scope of the present invention, a first component may be referred to as a second component, and similarly, the second component may also be referred to as the first component. Singular expressions include plural expressions unless the context clearly indicates otherwise.

In this application, it should be understood that terms such as "include" or "have" are intended to indicate that there is a feature, number, step, operation, component, part, or a combination thereof described on the specification, and they do not exclude in advance the possibility of the presence or addition of one or more other features or numbers, steps, operations, components, parts or combinations thereof.

Also, when a portion such as a layer, a film, an area, a plate, etc. is referred to as being "on" another portion, this includes not only the case where the portion is "directly on" the another portion but also the case where further another portion is interposed therebetween. On the other hand, when a portion such as a layer, a film, an area, a plate, etc. is referred to as being "under" another portion, this includes not only the case where the portion is "directly under" the another portion but also the case where further another portion is interposed therebetween. In addition, to be disposed "on" in the present application may include the case disposed at the bottom as well as the top.

Hereinafter, the present invention will be described in detail.

The internal short circuit test is a test for evaluating the resistance to internal short circuit among the safety tests of the battery, and is a test simulated when a positive electrode and a negative electrode are shorted inside the battery. In the internal short circuit test, a fully charged evaluation battery is first prepared, an internal short circuit is generated, and the behavior of the battery is evaluated. In general, when an internal short circuit occurs, the battery is discharged and the voltage decreases, and the test is performed until the voltage decreases below a certain value to evaluate the presence or absence of rupture, and the voltage and temperature of the battery, etc.

As an example of an internal short-circuit induction device designed for battery safety evaluation, in the case of an internal short circuit induction device developed by the National Energy Research Institute (NREL), an insulator made of wax is placed between the positive and negative electrodes to physically separate the positive and negative electrodes. Thereafter, when the battery is charged and discharged and the internal temperature of the battery rises to the melting point of the wax, the wax is removed, and the positive electrode and the negative electrode come into direct contact, causing a short circuit inside the battery.

Specifically, the conventional internal short circuit induction device creates a hole by perforating a part of a separator, inserts a block made of a metal material such as copper into the hole, and interposes a wax layer on one side of the metal block. In addition, the positive electrode plate is attached to the part of the separator where the wax layer is not interposed, and the negative electrode plate is attached to the wax layer. When the wax layer is removed, the positive electrode, the metal block, and the negative electrode come into direct contact, thereby causing a short circuit.

In a lithium ion secondary battery, a redox reaction occurs as lithium ions move between negative and positive electrodes. However, in the case of the battery having the conventional short circuit induction member as described above, an unreacted region was formed because it was impossible to move lithium ions due to the aluminum plate and the copper plate in the portion where the short circuit induction member is installed. Due to the unreacted region, battery performance such as capacity was reduced compared to conventional batteries, and the accuracy of the safety evaluation was reduced because it was difficult to simulate the correct behavior of the battery when an internal short circuit occurred. In addition, in the case of the conventional internal short circuit induction device, the manufacturing cost is high, and the battery cell should be disassembled and reassembled to include the structure of the short circuit induction device in order to reuse it after inserting it into the battery cell for assembly and testing. However, during the reassembly process, the assembly alignment may be distorted or the battery cell structure may be deformed, and this may cause unexpected safety problems.

In addition to the above-described method, there is a test method for the internal short circuit of a battery cell using a shape memory alloy. However, this also has a limitation that the battery should be heated to a certain temperature or higher, and as the shape of the shape memory alloy inserted inside the battery cell is deformed, there is a risk that other components of the battery cell other than the separator may be distorted.

Other known methods include nail penetration test and crush test. However, they irreversibly permanently deform the battery cell itself, and there is a problem in that a new battery cell should be manufactured for every test.

The electrochemical device including the short circuit induction member according to the present invention is a further improvement of the prior art, and the short circuit induction member includes a magnetic material, and the separator is peeled off as the short circuit induction member moves.

The electrochemical device according to the present invention specifically includes a positive electrode, a negative electrode, a separator and a short circuit induction member, and is applied to a secondary battery, a capacitor, and various energy storage devices to perform an internal short circuit test.

Specifically, in the case of a lithium secondary battery, an electrode assembly including the electrochemical device may have a structure built into a battery case, and depending on the shape of the secondary battery, it can be applied to most secondary batteries such as cylindrical batteries, pouch-type batteries, prismatic batteries, or coin-type batteries, but in one embodiment of the present invention, a pouch-type battery is used.

The electrode assembly has a structure in which a negative electrode and a positive electrode are alternately stacked with a separator interposed between the electrodes and impregnated with a lithium salt non-aqueous electrolyte. The electrode for the secondary battery may be manufactured by applying an electrode mixture containing an electrode active material on a current collector and then drying the electrode mixture. The electrode mixture may further include a binder, a conductive material, a filler, and the like, as necessary.

In the present invention, the positive electrode collector generally has a thickness of 3 to 500 micrometers. The positive electrode current collector is not particularly limited as long as it has high conductivity without causing a chemical change in the battery. Examples of the positive electrode current collector include stainless steel, aluminum, nickel, titanium, sintered carbon or aluminum or stainless steel of which the surface has been treated with carbon, nickel, titanium, silver, or the like. The current collector may have fine irregularities on the surface thereof to increase the adhesion of the positive electrode active material, and various forms such as a film, a sheet, a foil, a net, a porous body, a foam, and a nonwoven fabric are possible.

The sheet for the negative electrode collector generally has a thickness of 3 to 500 micrometers. The negative electrode current collector is not particularly limited as long as it has electrical conductivity without causing chemical changes in the battery, and examples thereof include copper, stainless steel, aluminum, nickel, titanium, sintered carbon, copper or stainless steel of which the surface has been treated with carbon, nickel, titanium, silver or the like, aluminum-cadmium alloy, or the like. In addition, like the positive electrode current collector, fine unevenness can be formed on the surface to enhance the bonding force of the negative electrode active material, and it can be used in various forms such as a film, a sheet, a foil, a net, a porous body, a foam, and a nonwoven fabric.

In the present invention, the positive electrode active material is a material capable of causing an electrochemical reaction and a lithium transition metal oxide, and contains two or more transition metals. Examples thereof include: layered compounds such as lithium cobalt oxide ($LiCoO_2$) and lithium nickel oxide ($LiNiO_2$) substituted with one or more transition metals; lithium manganese oxide substituted with one or more transition metals; lithium nickel oxide represented by the formula $LiNi_{1-y}M_yO_2$ (wherein M=Co, Mn, Al, Cu, Fe, Mg, B, Cr, Zn or Ga and contains at least one of the above elements, $0.01 \leq y \leq 0.7$); lithium nickel cobalt manganese composite oxide represented by the formula $Li_{1+z}Ni_bMn_cCo_{1-(b+c+d)}M_dO_{(2-e)}A_e$ such as $Li_{1+z}Ni_{1/3}Co_{1/3}Mn_{1/3}O_2$, $Li_{1+z}Ni_{0.4}Mn_{0.4}Co_{0.2}O_2$ etc. (wherein $-0.5 \leq z \leq 0.5$, $0.1 \leq b \leq 0.8$, $0.1 \leq c \leq 0.8$, $0 \leq d \leq 0.2$, $0 \leq e \leq 0.2$, b+c+d<1, M=Al, Mg, Cr, Ti, Si or Y, and A=F, P or Cl); olivine-based lithium metal phosphate represented by the formula $Li_{1+x}M+M'_yPO_{4-z}X_z$ (wherein M=transition metal, preferably Fe, Mn, Co or Ni, M'=Al, Mg or Ti, X=F, S or N, and $-0.5 \leq x \leq 0.5$, $0 \leq y \leq 0.5$, $0 \leq z \leq 0.1$).

Examples of the negative electrode active material include carbon such as non-graphitized carbon and graphite carbon; metal complex oxide such as $Li_xFe_2O_3 (0 \leq x \leq 1)$, $Li_xWO_2 (0 \leq x \leq 1)$, $Sn_xMe_{1-x}Me'_yO_z$ (Me: Mn, Fe, Pb, Ge; Me': Al, B, P, Si, groups 1, 2, and 3 of the periodic table, halogen; $0 \leq x \leq 1$; $1 \leq y \leq 3$; $1 \leq z \leq 8$); lithium alloy; silicon alloy; tin alloy; metal oxides such as SnO, $SnO_2$, PbO, $PbO_2$, $Pb_2O_3$, $Sb_2O_3$, $Sb_2O_4$, $Sb_2O_5$, GeO, $GeO_2$, $Bi_2O_3$, $Bi_2O_4$, and $Bi_2O_5$; conductive polymers such as polyacetylene; and Li—Co—Ni-based materials.

The conductive material is usually added in an amount of 1 to 30% by weight based on the total weight of the mixture including the positive electrode active material. Such a conductive material is not particularly limited as long as it has electrical conductivity without causing a chemical change in the battery, and examples thereof include graphite such as natural graphite and artificial graphite; carbon black such as carbon black, acetylene black, Ketjen black, channel black, furnace black, lamp black, and summer black; conductive fibers such as carbon fiber and metal fiber; metal powders such as carbon fluoride, aluminum and nickel powder; conductive whiskey such as zinc oxide and potassium titanate; conductive metal oxides such as titanium oxide; and conductive materials such as polyphenylene derivatives and the like.

The binder is added in an amount of 1 to 30% by weight, on the basis of the total weight of the mixture containing the positive electrode active material, as a component that assists in bonding between the active material and the conductive material and bonding to the current collector. Examples of such binders include polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, ethylene-propylene-diene terpolymer (EPDM), sulfonated EPDM, styrene butylene rubber, fluorine rubber, various copolymers and the like.

The filler is optionally used as a component for inhibiting expansion of an electrode, and is not particularly limited as long as it is a fibrous material without causing a chemical change in the battery. Examples of the filler include olefin polymers such as polyethylene and polypropylene; fibrous materials such as glass fibers and carbon fibers.

Other components, such as viscosity modifiers, adhesion promoters, and the like may be further included optionally or in combination of two or more. The viscosity modifier is a component that adjusts the viscosity of the electrode mixture so that the mixing process of the electrode mixture and the coating process on the current collector thereof may be easy, and may be added up to 30% by weight based on the total weight of the negative electrode mixture. Examples of such a viscosity modifier include carboxy methyl cellulose, polyvinylidene fluoride, and the like, but are not limited thereto. In some cases, the solvent described above may serve as a viscosity modifier.

The adhesion promoter is an auxiliary component added to improve the adhesion of the active material to the current collector and may be added in less than 10% by weight compared to the binder, and some examples thereof include oxalic acid, adipic acid, formic acid, acrylic acid derivatives, itaconic acid derivatives, and the like.

The separator is interposed between the positive electrode and the negative electrode, and an insulating thin film having high ion permeability and mechanical strength is used. The pore diameter of the separator is generally 0.01 to 10 micrometers, and the thickness is generally 5 to 300 micrometers. Examples of such a separator include olefin-based polymers such as polypropylene which is chemically resistant and hydrophobic; a sheet or a nonwoven fabric made of glass fiber, polyethylene or the like.

The lithium salt-containing non-aqueous electrolyte solution consists of an electrolyte and a lithium salt. And a non-aqueous organic solvent, an organic solid electrolyte, an inorganic solid electrolyte, and the like are used as the electrolyte solution.

Examples of the non-aqueous organic solvent include N-methyl-2-pyrrolidinone, propylene carbonate, ethylene carbonate, butylenecarbonate, dimethyl carbonate, diethyl carbonate, gamma-Butyrolactone, 1,2-dimethoxyethane, tetrahydroxyfuran, 2-methyltetrahydrofuran, dimethylsulfoxide, 1,3-dioxolane, formamide, dimethylformamide, dioxolane, acetonitrile, nitromethane, methyl formate, methyl acetate, phosphoric acid triester, trimethoxymethane, dioxolane derivatives, sulfolane, methyl sulfolane, 1,3-dimethyl- 2-imidazolidinone, propylene carbonate derivatives, tetrahydrofuran derivatives, ethers, methyl pyrophosphate, ethyl propionate, etc.

Examples of the organic solid electrolyte include a polymer electrolyte such as a polyethylene derivative, a polyethylene oxide derivative, a polypropylene oxide derivative, a phosphate ester polymer, an agitation lysine, a polyester sulfide, a polyvinyl alcohol, a polyvinylidene fluoride, a polymerizer including an ionic dissociation group, and the like.

Examples of the inorganic solid electrolyte include nitrides, halides, and sulfates of Li such as $Li_3N$, $LiI$, $Li_5NI_2$, $Li_3N$—$LiI$—$LiOH$, $LiSiO_4$, $LiSiO_4$—$LiI$—$LiOH$, $Li_2SiS_3$, $Li_4SiO_4$, $Li_4SiO_4$—$LiI$—$LiOH$, and $Li_3PO_4$—$Li_2S$—$SiS_2$.

The lithium salt is a substance that is soluble in the non-aqueous electrolyte. The examples of the lithium salt include $LiCl$, $LiBr$, $LiI$, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $(CF_3SO_2)_2NLi$, chloroborane lithium, lower aliphatic carboxylic acid lithium, lithium 4-phenylborate, imide and the like.

For the purpose of improving charge/discharge characteristics, flame retardancy, etc., pyridine, triethylphosphite, triethanolamine, cyclic ether, ethylenediamine, n-glyme, hexaphosphoric triamide, nitrobenzene derivative, sulfur, quinone imine dye, N-substituted oxazolidinone, N,N-substituted imidazolidine, ethylene glycol dialkyl ether, ammonium salt, pyrrole, 2-methoxyethanol, aluminum trichloride, etc. may be added to the electrolyte. In some cases, a halogen-containing solvent such as carbon tetrachloride or ethylene trifluoride may be further added to impart nonflammability, or a carbon dioxide gas may be further added to improve the high-temperature storage characteristics, and FEC (Fluoro-EthyleneCarbonate), PRS (Propene sultone), and the like may be further added.

In one preferred example, a lithium salt such as $LiPF_6$, $LiClO_4$, $LiBF_4$, and $LiN(SO_2CF_3)_2$ may be added to a mixed solvent of a cyclic carbonate of EC or PC which is a high-dielectric solvent and a linear carbonate of DEC, DMC or EMC which is low viscosity solvent to thereby prepare a non-aqueous electrolyte containing a lithium salt.

Specifically, the electrochemical device according to the present invention includes a structure in which a positive electrode, a separator, and a negative electrode are sequentially stacked. The separator has a structure in which a linear perforated line is formed, and includes a short circuit induction member attached to one or both sides of the separator adjacent to the perforated line.

At this time, the perforated line is characterized in that it is formed along a straight line, a curve, or a line formed of a combination of a straight line and a curve on the separator. That is, the shape of the line is not limited except for the shape of a single closed curve in which the line forms a closed figure such as a circle or a polygon. Although it is not impossible to apply even when a figure forming a single closed curve is formed, the line is preferably formed in an open linear shape in order to easily cause a peel-off according to the movement of the short circuit induction member in one direction.

Meanwhile, the perforated line is characterized in that it is made of a plurality of through-type slits or non-through-type grooves. However, in the case of a perforated line made of a through-type slit, if the width of the opening of the separator by the formed slit is wide, a problem of short-circuiting may occur before the positive electrode and the negative electrode come into contact with each other to induce a short circuit. Therefore, when forming the through-type slit, it is preferable to be linear, but it is preferable that the width is sufficiently narrow so that the positive electrode and the negative electrode do not contact. In this case, a linear cutter may be used to form the slit.

In addition, in the case of the non-through-type groove, the size or shape of the groove is not limited, such as linear, circular, polygonal, etc. In this case, the groove may be formed by pressing the separator using a pressing device to the groove-shaped protrusion along the line to be created.

The short circuit induction member is characterized in that it contains one or two or more types of magnetic material selected from Fe, Ni, and Co, whereby the movement of the short circuit induction member becomes possible by the magnetic field applied at a position separated from the electrochemical device.

In addition, as the short circuit induction member moves, the separator on which the perforated line is formed is broken, and the positive electrode and the negative electrode directly contact each other through the broken portion, thereby causing an internal short circuit of the electrochemical device.

However, since the magnetic material included in the short circuit induction member may cause a short circuit when in contact with the positive electrode or the negative electrode, the outer circumferential surface may be surrounded by an insulating material. In this case, the insulating material may be a porous polymer film.

Meanwhile, one or more of the short circuit induction members may be attached to an end of the cover unit by a binder. The magnetic part is for moving the short circuit induction member by a magnetic field applied from the outside of the battery cell, and when the short-circuit induction member moves according to the direction of the magnetic field, the separator may be peeled off along the perforated line. Accordingly, as the exposed positive electrode and negative electrode can directly contact, an internal short circuit of the battery cell occurs. That is, by attaching the short circuit induction member as described above to the separator, when a magnetic field is applied at a position spaced apart from the electrochemical device including the short circuit induction member, the separator is peeled off along the perforated line while moving the position of the short circuit induction member according to the direction of the magnetic field.

If the binder for attaching the short circuit induction member to the separator is designed so as not to affect the separator and the electrode layer of the short circuit induction member, and to prevent the conduction between the electrodes when a short circuit occurs by the short circuit induction member, there are no specific restrictions on the types of chemicals, and an epoxy resin composition may be used as long as the adhesive force is not lowered by the internal electrolyte.

Such binders may be made of one or more materials selected from polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, epoxy resin, ethylene-propylene-diene polymer (EPDM), sulfonated EPDM, styrene butadiene rubber or copolymers thereof.

In particular, polyvinylidene fluoride (PVDF) among the chemicals is a material commonly used as a binder for electrodes, and has excellent chemical resistance and good mechanical, thermal, and electrical properties, which are advantages of fluorine resin. As such, it does not interfere with the electrical connection inside the battery cell while maintaining the adhesion between the short circuit induction member and the separator.

Meanwhile, the safety evaluation method according to an internal short circuit using the electrochemical device can be used without limitation in an energy storage device including a positive electrode, a negative electrode, and a separator, such as a battery cell for a secondary battery and a capacitor, and specifically can be performed through the following steps:

preparing a separator having a perforated line formed thereon;

attaching a short circuit induction member including a magnetic material at a position adjacent to the perforated line;

applying a magnetic field to the short circuit induction member; and moving the short circuit induction member to break a perforated line portion of the separator.

When the short circuit induction member is moved to break the separator according to the above-described step, the positive electrode and the negative electrode directly contact through the broken portion, thereby inducing an internal short circuit. According to an embodiment of the present invention, by manufacturing a battery cell including the electrochemical device, an internal short circuit inside the secondary battery may be induced.

Hereinafter, with reference to the drawings, an electrochemical device including the short circuit induction member according to the present invention and a battery cell structure including the same and a safety evaluation method will be described in more detail.

FIG. 1 shows a structure of a battery cell 100 including an electrochemical device as an embodiment according to the present invention. The battery cell 100 may include a positive electrode 110, a negative electrode 120, and a separator 130 interposed therebetween, and the positive electrode 110 and the negative electrode 120 and the separator 130 may be accommodated in a pouch type case 140.

A perforation line 131 in a "C" shape is formed on the separator 130, and the perforated line may be formed as a plurality of linear slits or linear grooves. In the case of a slit, a cutter may be used, and in the case of a groove, a pressurizing jig may be used, but the method of forming the perforated line 131 is not limited thereto. Meanwhile, a short circuit induction member 132 is attached adjacent to the perforation line, and as the short circuit induction member 132 is moved, the separator at the portion to which the short circuit induction member 132 is attached moves, and breakage (peel-off) occurs along the perforated line 131.

FIG. 2 shows a structure of another battery cell 200 including an electrochemical device as another embodiment according to the present invention. The battery cell 200 has a structure similar to that of the embodiment of FIG. 1, and may include a positive electrode 210, a negative electrode 220, and a separator 230 interposed therebetween. The positive electrode 210 and the negative electrode 220 and the separator 230 may be accommodated in a pouch type case 240.

A perforation line 231 in a "<" shape is formed on the separator 230, and the perforated line may be formed as a plurality of linear slits or linear grooves. In the case of a slit, a cutter may be used, and in the case of a groove, a pressurizing jig may be used, but the method of forming the perforated line 231 is not limited thereto. Meanwhile, a short circuit induction member 232 is attached adjacent to the perforation line, and as the short circuit induction member 232 is moved, the separator at the portion to which the short circuit induction member 232 is attached moves, and breakage (peel-off) occurs along the perforated line 231. The "<"-shaped perforated line is designed to gradually widen the width of the broken portion as the short circuit induction member 232 moves, and the perforated line is formed in a shape for easily causing the breakage (peel-off) of the separator with a small force.

A process of inducing a short circuit by applying a magnetic field at a distance from the electrochemical device is schematically shown in FIG. 3.

Referring to FIG. 3 to describe the process of inducing an internal short circuit in more detail, first, as in (a) of FIG. 3, by using a permanent magnet 10 or a device capable of applying a magnetic field, a magnetic field is applied to the short circuit induction member attached to the electrochemical device from the outside of the battery cell.

The magnetic field is applied to the magnetic material included in the short circuit induction member, and may be applied along a direction in which a perforated line is not formed as indicated by an arrow so that the separator may be broken along the perforated line.

Next, referring to (b) of FIG. 3, the short circuit induction member moves inside the battery cell according to the magnetic field applied from the outside, whereby the separator in the area where the short circuit induction member is attached moves, and the separator breaks along the perforated line. As a result, the positive electrode and the negative electrode of the broken part come into direct contact, causing a short circuit, and it becomes possible to evaluate the safety of the battery cell in which the internal short circuit is induced.

DESCRIPTION OF REFERENCE NUMERALS

10: permanent magnet
100: battery cell
110: positive electrode
120: negative electrode
130: separator
131: perforated line
132: short circuit induction member
140: battery case
200: battery cell
210: positive electrode
220: negative electrode
230: separator
231: perforated line
232: short circuit induction member
240: battery case

The invention claimed is:

1. An electrochemical device comprising a positive electrode, a separator, and a negative electrode are sequentially stacked,
wherein the separator comprises a linear perforated line,
a short circuit induction member disposed on one side or both sides of the separator adjacent to the perforated line, and
the separator is a single layer,
wherein the short circuit induction member is moved by a magnetic field applied from a position spaced apart from the electrochemical device, and
wherein the perforated line is capable of broken according to the movement of the short circuit induction member.

2. The electrochemical device of claim 1, wherein the separator includes the perforated line along a straight line, a curve, or a line formed of a combination of a straight line and a curve on the separator.

3. The electrochemical device of claim 1, wherein the perforated line comprises a plurality of through-type slits or non-through-type grooves.

4. The electrochemical device of claim 1, wherein the short circuit induction member includes one or more magnetic materials selected from Fe, Ni, and Co.

5. The electrochemical device of claim 4, wherein an outer peripheral surface of the one or more magnetic materials is surrounded by an insulating material.

6. The electrochemical device of claim 5, wherein the insulating material comprises a porous polymer film.

7. The electrochemical device of claim 1, wherein the short circuit induction member is attached to the separator by a binder.

8. The electrochemical device of claim 7, wherein the binder contains one or more materials selected from polyvinylidene fluoride, polyvinyl alcohol, carboxymethylcellulose (CMC), starch, hydroxypropylcellulose, regenerated cellulose, polyvinylpyrrolidone, tetrafluoroethylene, polyethylene, polypropylene, epoxy resin, ethylene-propylene-diene polymer (EPDM), sulfonated EPDM, styrene butadiene rubber or copolymers thereof.

9. The electrochemical device of claim 1, wherein the separator includes the perforated line along a straight line on the separator.

10. The electrochemical device of claim 1, wherein the separator includes the perforated line along a curve on the separator.

11. The electrochemical device of claim 1, wherein the separator includes the perforated line along or a line formed of a combination of a straight line and a curve on the separator.

12. A method for evaluating safety according to an internal short circuit of a battery, comprising:
preparing a separator having a perforated line formed thereon;
attaching a short circuit induction member including a magnetic material at a position adjacent to the perforated line;
applying a magnetic field to the short circuit induction member; and
moving the short circuit induction member to expose the perforated line portion,
wherein the separator is a single layer, and
wherein the moving the short circuit induction member to expose the perforated line portion induces a short circuit by peeling off the separator along the perforated line, thereby a positive electrode and a negative electrode included in the separator directly contact to each other through a broken portion created by the peeling of the separator.

* * * * *